(12) United States Patent
Hanson et al.

(10) Patent No.: US 8,372,754 B2
(45) Date of Patent: Feb. 12, 2013

(54) METHODS FOR REMOVING PHOTORESIST DEFECTS AND A METHOD FOR PROCESSING A SEMICONDUCTOR DEVICE STRUCTURE

(75) Inventors: Robert J. Hanson, Boise, ID (US); Siddartha Kondoju, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1439 days.

(21) Appl. No.: 11/786,306

(22) Filed: Apr. 11, 2007

(65) Prior Publication Data
US 2008/0254637 A1  Oct. 16, 2008

(51) Int. Cl.
*H01L 21/302* (2006.01)

(52) U.S. Cl. .................. 438/710; 438/725; 216/67

(58) Field of Classification Search .................. 438/710, 438/725; 216/67
See application file for complete search history.

(56) References Cited

U.S. PATENT DOCUMENTS

| | | | |
|---|---|---|---|
| 5,811,358 A * | 9/1998 | Tseng et al. | 438/725 |
| 5,980,768 A | 11/1999 | Abraham | |
| 6,455,431 B1 | 9/2002 | Hsieh et al. | |
| 2001/0005635 A1 * | 6/2001 | Kitagawa | 438/710 |
| 2001/0005638 A1 * | 6/2001 | Yang et al. | 438/710 |
| 2003/0075524 A1 * | 4/2003 | Kawaguchi et al. | 216/67 |
| 2003/0114010 A1 * | 6/2003 | Jung | 438/707 |
| 2005/0164512 A1 * | 7/2005 | Cho et al. | 438/706 |
| 2006/0040474 A1 * | 2/2006 | Shieh et al. | 438/474 |
| 2007/0232064 A1 * | 10/2007 | Oh et al. | 438/675 |
| 2007/0269975 A1 * | 11/2007 | Savas et al. | 438/637 |

* cited by examiner

*Primary Examiner* — Binh X Tran
(74) *Attorney, Agent, or Firm* — TraskBritt (57) ABSTRACT

A method for removing at least one photoresist defect is disclosed. The photoresist defect is exposed to a plasma produced from a source gas including oxygen and a non-oxidizing gas in a plasma reactor, wherein the oxygen is present in the source gas at from 1% by volume to about 89% by volume. The non-oxidizing gas includes a mixture of hydrogen and nitrogen, ammonia or combinations thereof. A method for processing a semiconductor device structure is also disclosed, as are embodiments of the source gas.

27 Claims, 6 Drawing Sheets

METHODS FOR REMOVING PHOTORESIST DEFECTS AND A METHOD FOR PROCESSING A SEMICONDUCTOR DEVICE STRUCTURE

FIELD OF THE INVENTION

Embodiments of the invention relate generally to the manufacture of semiconductor devices and, more specifically, to methods and a source gas for removing photoresist defects.

BACKGROUND

As the size of integrated circuits (ICs) continually decreases, chip manufacture is limited largely by critical dimension (CD). As used herein, "CD" means and includes the dimension of a smallest geometrical feature(s) (width of interconnect line, contacts, trenches, etc.) formed during semiconductor device manufacturing. Adjusting the CD and providing proper patterning of underlying material layers is difficult when using a photoresist material. However, photoresist integrity must be maintained throughout the photolithography process because any flaw or defect present on a patterned photoresist layer is transferred to an underlying layer(s) during a subsequent etch process.

One example of a photoresist defect that results in poor pattern transfer to the underlying layer is photoresist scum or scumming. Photoresist scum is caused by incomplete removal of portions of the photoresist layer, as well as formation of organic residues on portions of the underlying layer. Because the photoresist scum produces a variation in CD, the photoresist scum is typically removed prior to subsequent processing steps. The photoresist defect is removed in a so-called "descumming" process by plasma treating a patterned and developed photoresist layer with a source gas that includes at least 90% by volume oxygen ($O_2$), with the balance being a so-called "forming gas" (such as 4% hydrogen ($H_2$) in nitrogen ($N_2$)). However, removing the photoresist scum with this source gas damages or deteriorates the photoresist layer, leading to line-edge roughness (LER) in layers patterned using the photoresist layer. As used herein, "LER" means and includes a deviation of a feature edge, as viewed from a top-down perspective, from a smooth, ideal shape. The deviation in LER results in increased CDs. As CD shrinks, LER becomes an increasingly large fraction of the CD tolerance budget.

FIGS. 1A-1D illustrate a portion of a conventional process employed in the fabrication of an intermediate semiconductor device structure 10 that includes a substrate 12, an oxide layer 14 and a photoresist layer 16. The photoresist layer 16 is patterned and developed. The pattern in the photoresist layer 16 has a width of "w1," which, ideally, corresponds to the CD of the feature(s) ultimately to be formed in the oxide layer 14 or substrate 12. However, after development, photoresist defect 18 is present on portions of the intermediate semiconductor device structure 10, which affects w1 and prevents uniform and efficient etching of the underlying layers. When the above-mentioned source gas is used to remove the photoresist defect 18, remaining portions of the photoresist layer 16 may be damaged at an interface 20, which damage is schematically illustrated in FIG. 1B using a wavy line. When the pattern in the photoresist layer 16 is transferred to the underlying layers, the damage in the photoresist layer 16 produces a high degree of LER in the underlying layers. FIGS. 1C and 1D illustrate the intermediate semiconductor device structure 10 after etching the oxide layer 14 and removing the photoresist layer 16. The oxide layer 14 has a high degree of LER caused by the damage in the photoresist layer 16, which is schematically illustrated in FIGS. 1C and 1D using a wavy line. The feature formed in the oxide layer 14 has a width of w2 that deviates from w1 (w2 is either less than or greater than w1) due to the LER. The LER in the oxide layer 14 causes fluctuations in w2, which is problematic in maintaining overall CD during semiconductor device fabrication. As a result of the LER in the oxide layer 14, the CD of the feature to be formed in the oxide layer 14 undesirably varies from w1.

U.S. Pat. No. 5,980,768 discloses a method for removing photoresist mask defects from a wafer or for removing an organic antireflective layer. The method uses an etchant source gas that includes nitrogen and is substantially oxidant free to remove scumming layer defects and/or sloped foot photoresist mask defects. The etch is performed in a chamber, such as a chamber for dry etching, plasma etching, reactive ion etching, magnetically enhanced reactive ion etching, or electron cyclotron resonance.

Due to decreasing CDs, removing undesired portions of a photoresist mask becomes increasingly difficult without affecting LER. Thus, improved methods of removing photoresist defects are desirable.

BRIEF DESCRIPTION OF THE SEVERAL VIEWS OF THE DRAWINGS

FIGS. 1A-1C are cross-sectional views of an intermediate semiconductor device structure during various stages of fabrication according to conventional process techniques and FIG. 1D is a top-down view of the intermediate semiconductor device structure illustrated in FIG. 1C;

FIGS. 2A-2C are cross-sectional views of an embodiment of an intermediate semiconductor device structure of the present invention during various stages of fabrication and FIG. 2D is a top-down view of the embodiment illustrated in FIG. 2C;

DETAILED DESCRIPTION OF THE INVENTION

An embodiment of a method of the present invention for removing at least one photoresist defect from an intermediate semiconductor device structure is disclosed, as are embodiments of a source gas of the present invention. As used herein, the term "photoresist defect" means and includes photoresist material or organic residue remaining on at least a portion of the intermediate semiconductor device structure after development of the photoresist material. The photoresist defect may be caused by incomplete removal of the developed photoresist material from the intermediate semiconductor device structure. The photoresist defect may comprise a layer or film of photoresist material or organic residue, or a nonplanar mass of the photoresist material or organic residue, such as a three-dimensional mass having a substantially nonplanar configuration. For the sake of example only, the photoresist defect may be a "foot" formed from the photoresist material.

The photoresist defect is removed using a plasma generated from a source gas that includes oxygen ($O_2$) in a range of from about 1% by volume to about 89% by volume and a non-oxidizing gas. The non-oxidizing gas may include, for example, a mixture of hydrogen ($H_2$) and nitrogen ($N_2$), ammonia ($NH_3$) or combinations thereof. In one embodiment, the non-oxidizing gas is the mixture of $H_2$ and $N_2$. The mixture of $H_2$ and $N_2$ may include from about 2% by volume to about 25% by volume of $H_2$, with the remainder being $N_2$. Thus, the non-oxidizing gas may include $H_2$ and $N_2$ in a ratio of from about 2:98 to about 1:3. In another embodiment, the non-oxidizing gas is $NH_3$. When $NH_3$ is used as the non-oxidizing gas, the $NH_3$ may account for from about 11% by volume to about 99% by volume of the source gas. Selecting the appropriate non-oxidizing gas may depend on the presence or absence of additional material layers that may be exposed to the plasma. For the sake of example only, if the intermediate semiconductor device structure includes at least one exposed metal layer, $NH_3$ may be used as the non-oxidizing gas to prevent oxidation of the metal layer. However, if the intermediate semiconductor device structure does not include an exposed metal layer, the $NH_3$ or the mixture of $H_2$ and $N_2$ may be used as the non-oxidizing gas.

As shown in FIGS. 2A-2D, the source gas may be used to remove at least one photoresist defect 18 from a substrate in the form of an intermediate semiconductor device structure 10. The intermediate semiconductor device structure 10 includes substrate 12, a dielectric layer 15 and photoresist layer 16. As used herein, the term "substrate" means and includes a base material or construction upon which material layers, such as dielectric layer 15 and photoresist layer 16, are formed. The substrate 12 may be a semiconductor substrate, a base semiconductor layer on a supporting structure, a metal electrode or a semiconductor substrate having one or more layers, structures or regions formed thereon. By way of non-limiting example, the dielectric layer 15 may be an oxide layer, a nitride layer or a polysilicon layer having a hydrophilic surface. In one embodiment, the dielectric layer 15 is an oxide layer. The dielectric layer 15 may be deposited on the substrate 12 by conventional techniques, which are not described in detail herein. In one embodiment, dielectric layer 15 is a gate oxide layer. The photoresist layer 16 may be formed from a positive or negative photoresist material. Such photoresist materials are known in the art and, therefore, are not described in detail herein. The photoresist layer 16 is illustrated in FIG. 2A as being patterned. The photoresist material may be deposited on the dielectric layer 15, patterned and developed by conventional, photolithographic techniques. Photoresist materials and photolithographic techniques are well known in the art and, therefore, selecting, depositing, patterning and developing the photoresist material are not discussed in detail herein. The pattern in the photoresist layer 16 has a width of "w3," which, ideally, corresponds to the CD of the feature(s) ultimately to be formed in the dielectric layer 15 or substrate 12.

To remove the photoresist defect 18, the intermediate semiconductor device structure 10 may be placed in a plasma chamber or plasma reactor (not shown) and exposed to a plasma 19 produced from the source gas. The plasma chamber may be any chamber that is capable of striking the source gas into the plasma 19. The plasma chamber may include, but is not limited to, an inductively coupled plasma (ICP) reactor, an electron-cyclotron reactor (ECR), a downstream ICP reactor or a downstream microwave reactor, and the like. The plasma 19 may be produced from the source gas by conventional techniques, which are not described in detail herein. For the sake of example only, the plasma chamber may be a RapidStrip or RadiantStrip dry strip system, each of which is commercially available from Axcelis Technologies, Inc. (Beverly, Mass.), or an ENVIRO OPTIMA™ Resist Strip System, which is commercially available from Ulvac Technologies, Inc. (Methuen, Mass.).

The source gas may be introduced into the plasma chamber at a flow rate of from about 2000 standard cubic centimeters per minute (sccm) to about 8000 sccm. In one embodiment, the flow rate of the source gas is about 6000 sccm. The plasma 19 may be struck from the source gas by applying power to electrodes of the plasma chamber or by administration of radiation to a remote plasma tube. For the sake of example only, the power may be within a range of from about 500 W to about 3000 W. During the removal of the photoresist defect 18, the pressure within the plasma chamber may be maintained within a range of from about 0.5 torr to about 1.4 torr. A surface temperature of a chuck on which the intermediate semiconductor structure 10 is placed in the plasma chamber may be maintained within a range of from about 70° C. to about 100° C. The temperature of the intermediate semiconductor device structure 10 during the removal of the photoresist defect 18 may be substantially similar to the surface temperature of the chuck, such as within 0.5° C. to 1° C. of the surface temperature of the chuck. In one embodiment, the temperature of the substrate 12 may be maintained at about 70° C. and the plasma chamber may be maintained at a pressure of about 1 torr. The intermediate semiconductor device structure 10 may be exposed to the plasma 19 for a sufficient amount of time to remove the photoresist defect 18. The exposure time may range from about 10 seconds to about 30 seconds. By way of non-limiting example, an exposure time of about 20 seconds may remove from about 100 Å to about 300 Å of the photoresist defect 18.

As previously mentioned, the source gas may include $O_2$ in a range of from about 1% by volume to about 89% by volume. By way of non-limiting example, the $O_2$ may account for from about 1% by volume to about 80% by volume of the source gas, from about 1% by volume to about 70% by volume of the source gas, from about 1% by volume to about 60% by volume of the source gas, from about 1% by volume to about 50% by volume of the source gas, from about 1% by volume to about 40% by volume of the source gas, from about 1% by volume to about 30% by volume of the source gas, from about 1% by volume to about 20% by volume of the source gas or from about 1% by volume to about 10% by volume of the source gas. In one embodiment, the $O_2$ accounts for from about 1% by volume to about 10% by volume of the source gas. The non-oxidizing gas may be present in the source gas in a range of from about 11% by volume to about 99% by volume. As previously mentioned, the non-oxidizing gas may be the mixture of $H_2$ and $N_2$ or may be $NH_3$. By way of non-limiting example, the mixture of $H_2$ and $N_2$ may include $H_2$ in a range of from about 2% by volume to about 25% by volume and $N_2$ in a range of from about 75% by volume to about 98% by volume.

In one embodiment, removal of the photoresist defect 18 may be performed in the plasma chamber by exposing the intermediate semiconductor device structure 10 to the plasma 19 formed from the source gas that includes 5% by volume of $O_2$ and 95% by volume of the non-oxidizing gas, which includes 4% by volume of $H_2$ in $N_2$. In another embodiment, removal of the photoresist defect 18 may be performed in the plasma chamber by exposing the intermediate semiconductor device structure 10 to the plasma 19 formed from the source gas that includes 1.25% by volume of $O_2$ and 98.75% by volume of the non-oxidizing gas, which includes 4% by volume of $H_2$ in $N_2$.

FIG. 2B shows the intermediate semiconductor device structure 10 after removing the photoresist defect 18 with the source gas of one of the embodiments described above. Since the source gas includes substantially less oxygen than is conventionally used in a descumming process, the photoresist defect 18 is removed in a significantly less oxidizing environment, which decreases or eliminates degradation of the photoresist layer 16 at an interface 20 between the dielectric layer 15 and the photoresist layer 16. The photoresist layer 16 may exhibit a relatively low degree of damage after descumming, which is schematically illustrated in FIG. 2C using a substantially straight line. Because the interface 20 is maintained, an abrupt transition is present between the photoresist layer 16 and the dielectric layer 15. As such, exposed portions of the dielectric layer 15 may be controllably removed, as described below, during subsequent processing, and undercutting of the photoresist layer 16 may be reduced or substantially eliminated.

A buffered oxide etch (BOE) may be performed to transfer the pattern in the photoresist layer 16 to the dielectric layer 15, as shown in FIG. 2C. The BOE may be an etchant that includes ammonium fluoride ($NH_4F$) and hydrogen fluoride (HF) in a ratio of about 100 $NH_4F$:1 HF. Since the interface 20 is maintained during the removal of the photoresist defect 18 and the subsequent BOE, undercutting of the photoresist layer 16 during the BOE may be substantially reduced or eliminated. The photoresist layer 16 may subsequently be removed by conventional techniques, which are not described in detail herein. For the sake of example only, the photoresist layer 16 may be removed using a photoresist strip system, such as the RapidStrip, RadiantStrip or ENVIRO OPTIMA™ Resist Strip System, or using a wet etch chemistry, such as a piranha etch (a mixture of sulfuric acid, hydrogen peroxide and deionized water).

Since the interface 20 of the photoresist layer 16 is substantially maintained, the LER of the feature formed in the dielectric layer 15 is substantially improved, which is schematically illustrated in FIGS. 2C and 2D using a substantially straight line. The width of the feature in dielectric layer 15 is "w4," which corresponds to the CD of the feature(s) formed in the dielectric layer 15 or to be formed in the substrate 12. Due to the improvement in LER, w3 and w4 may be substantially equivalent and the desired CD may be achieved during the semiconductor device fabrication.

Removing the photoresist defect 18 utilizing the source gas according to an embodiment of the invention results in decreased CD bias and increased within wafer uniformity. Thus, the overall process capability is improved as IC critical dimensions continue to shrink and photoresist process control becomes more important. While not wishing to be bound by theory, it is believed that the increased amount of $H_2$ in the source gas of the present invention reduces the photoresist material, forming volatile methane-type byproducts that may be pumped away from the reaction. In contrast, in conventional processes that utilize source gases with increased oxygen amounts (and, therefore, lower $H_2$ amounts), the oxygen reduces the photoresist material to form carbon monoxide (CO) and carbon dioxide ($CO_2$).

Additionally, using the source gas to remove the photoresist defect 18 may enable time-consuming and expensive acts in semiconductor fabrication to be eliminated. For example, since the source gas does not damage the interface 20 between the dielectric layer 15 and the photoresist layer 16, conventionally employed process acts, such as resist adhesion promotion acts, may potentially be eliminated from the process sequence. Removal of these acts may make semiconductor manufacturing more robust to staging and timing issues between the method of removing the photoresist defects and the BOE.

The following examples serve to explain embodiments of the present invention in more detail. These examples are not exhaustive or exclusive as to the scope of this invention. Although various plasma chambers offered by different manufacturers were employed with different source gases as noted in the examples, the inventors have determined that the process is source gas chemistry-dependent rather than equipment-dependent.

EXAMPLES

Example 1

Removal of Photoresist Defects and Mean CD Bias in Semiconductor Device Structures Intermediate semiconductor device structures that included a silicon substrate and a gate oxide were formed by methods known in the art. A photoresist layer was formed over the gate oxide, patterned and developed, which produced photoresist defects on the oxide layer. To remove the photoresist defects, the intermediate semiconductor device structures were placed in a plasma chamber and exposed to each of the source gases shown in Table 1. The temperature, pressure and power at which the plasma chamber was maintained are also shown in Table 1, as are the flow rate of the source gases and the exposure time. A RadiantStrip system was used as the plasma chamber for the source gas labeled "Comparative Example 1," a RapidStrip system was used for the source gas labeled "Comparative Example 2," and an ENVIRO OPTIMA™ Resist Strip system was used for the source gases labeled "Sample 1" and "Sample 2," each of which comprises an embodiment of the present invention.

TABLE 1

Source Gas Chemistries for Removing Photoresist Defects.

| Source Gas | $O_2$ (% volume) | 4% $H_2$ in $N_2$ (% volume) | Temp (° C.) | Flow Rate (sccm) | Pressure (torr) | Power (watts) | Duration (sec) | CD Bias |
|---|---|---|---|---|---|---|---|---|
| Comparative Example 1 | 95 | 5 | 85 | 4700 | 0.5 | 1000 | 20 | 1.00 |

TABLE 1-continued

Source Gas Chemistries for Removing Photoresist Defects.

| Source Gas | O$_2$ (% volume) | 4% H$_2$ in N$_2$ (% volume) | Temp (° C.) | Flow Rate (sccm) | Pressure (torr) | Power (watts) | Duration (sec) | CD Bias |
|---|---|---|---|---|---|---|---|---|
| Comparative Example 2 | 97 | 3 | 90 | 6000 | 0.8 | 1000 | 15 | 1.04 |
| Sample 1 | 1.25 | 98.75 | 70 | 1000 | 0.7 | 1800 | 20 | 0.77 |
| Sample 2 | 5 | 95 | 70 | 2000 | 1.4 | 3000 | 22 | 0.63 |

The removal of the photoresist defects was followed by a BOE to etch the oxide layers and a photoresist strip process to remove the photoresist layers using the same systems as described above. The CD bias of each resulting intermediate semiconductor device structure was determined from the difference between an after-development inspection critical dimension (ADI CD) and an after-clean inspection critical dimension (ACI CD). The CD bias measurements are shown in Table 1 as normalized values. The normalized values were obtained by dividing the individual CD bias measurement obtained for each tested source gas by the average result of the CD bias measurement for Comparative Example 1, setting the mean of the Comparative Example 1 CD bias to 1.0. The ADI CD was performed to measure the CD between portions of the photoresist layer after development of the photoresist layer. The ACI CD was performed to measure the CD between etched portions of the oxide layer after exposing the intermediate semiconductor device structures to the plasma produced by the source gas, the BOE and the photoresist strip process. Measurement of CDs may be performed by any means known in the art including, but not limited to, an SEM, a Critical Dimension Scanning Electron Microscope (CD-SEM) and a Field-Effect Scanning Electron Microscope (FESEM).

As shown in Table 1, the CD biases utilizing the source gases designated as "Sample 1" and "Sample 2" were significantly less than the CD biases utilizing Comparative Example 1 and Comparative Example 2 as the source gases.

Figure 3:
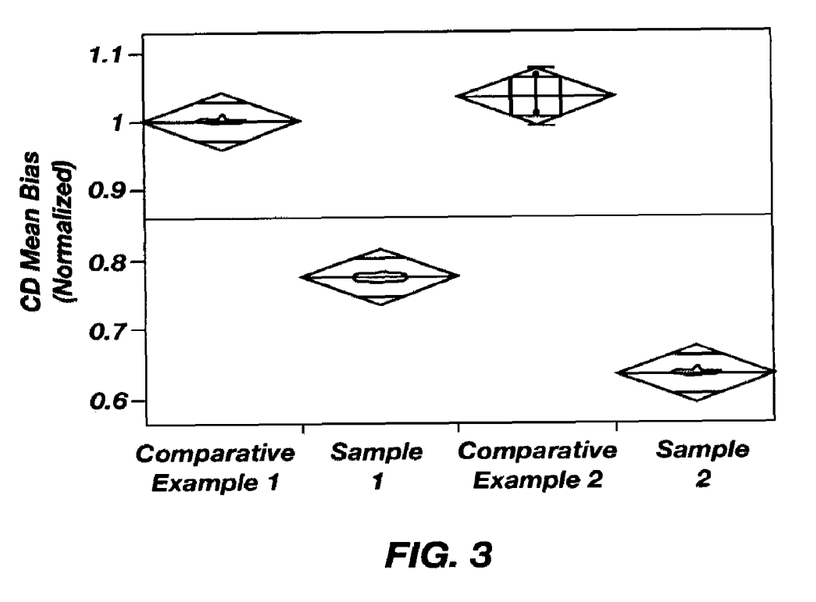
FIG. 3 is a plot showing mean CD bias in intermediate semiconductor device structures resulting from use of conventional source gases in comparison to embodiments of the present invention.
Figure 4:
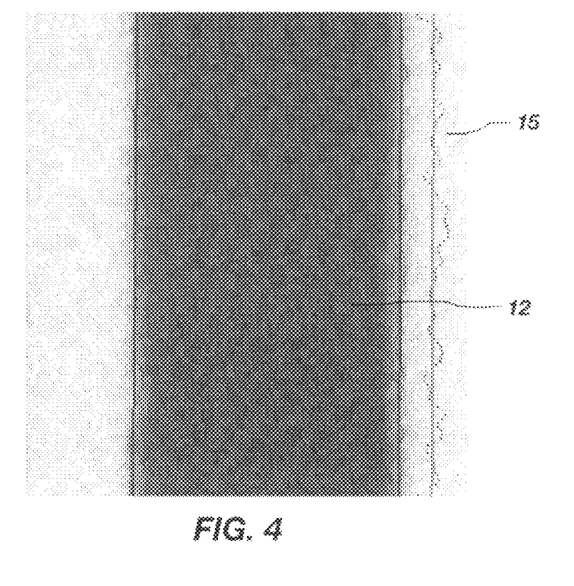
FIGS. 4-7 are scanning electron micrographs showing LER in intermediate semiconductor device structures resulting from use of conventional source gases in comparison to embodiments of the present invention.
Figure 5:
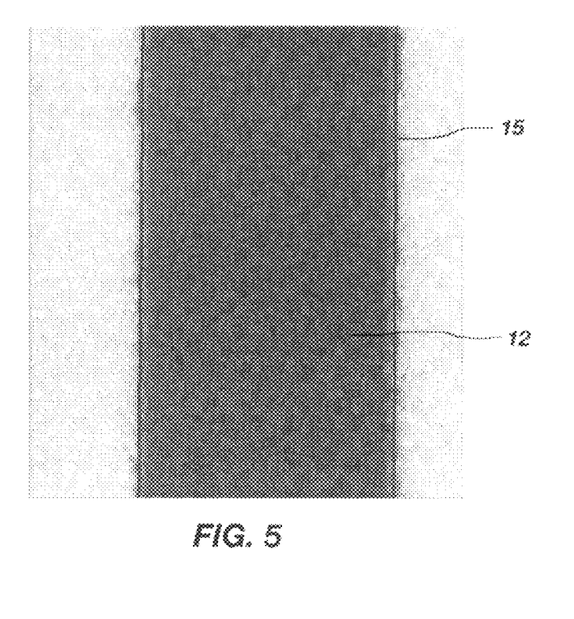
Figure 6:
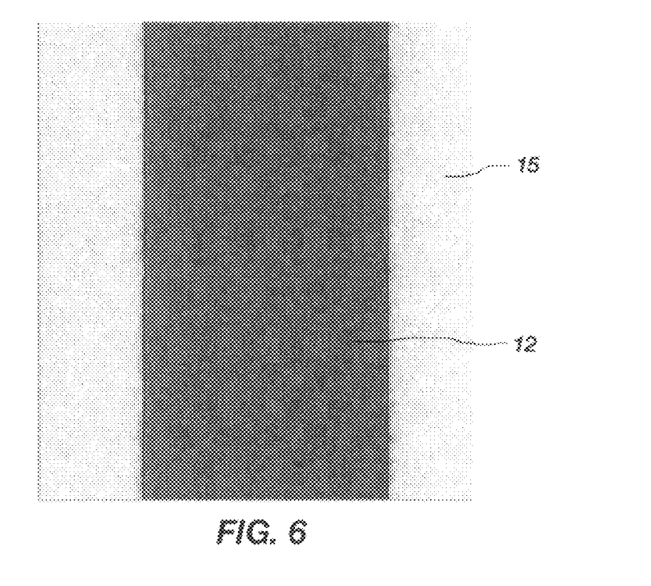
Figure 7:
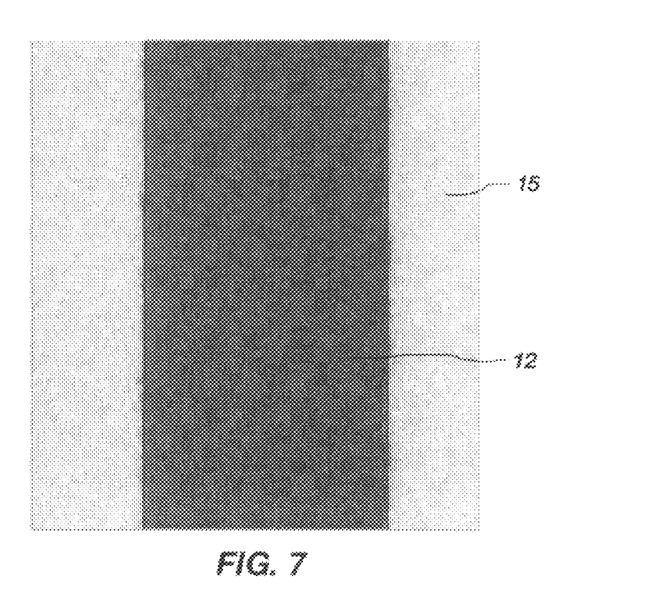

FIG. 3 is a plot of the mean CD bias in intermediate semiconductor device structures resulting from removal of photoresist defects using the source gases having the O$_2$ concentrations shown in Table 1. FIGS. 4-7 are SEM photographs showing the LER in the intermediate semiconductor device structures formed by removing the photoresist defects using the source gases described in Table 1. Specifically, these photographs show the silicon substrate 12 and the dielectric layer 15 (an oxide layer) of the intermediate semiconductor device structures. FIG. 4 shows the LER of the intermediate semiconductor structure exposed to the Comparative Example 1 source gas. FIG. 5 shows the LER of the intermediate semiconductor structure exposed to the Comparative Example 2 source gas. FIG. 6 shows the LER of the intermediate semiconductor structure exposed to the "Sample 1" source gas. FIG. 7 shows the LER of the intermediate semiconductor structure exposed to the "Sample 2" source gas. The intermediate semiconductor device structures exposed to the "Sample 1" source gas and the "Sample 2" source gas according to embodiments of the present invention had decreased LERs compared to the intermediate semiconductor device structures exposed to the Comparative Example 1 and the Comparative Example 2 source gases.

As shown in Table 1 and FIGS. 3-7, removal of the photoresist defects from the intermediate semiconductor device structure using the "Sample 2" source gas resulted in the lowest CD bias (0.65), whereas the removal of the photoresist defects from the semiconductor device structure using the Comparative Example 2 source gas resulted in the highest CD bias (1.04). Thus, the mean CD bias generally decreases as the concentration of O$_2$ in the source gas decreases.

Figure 8:
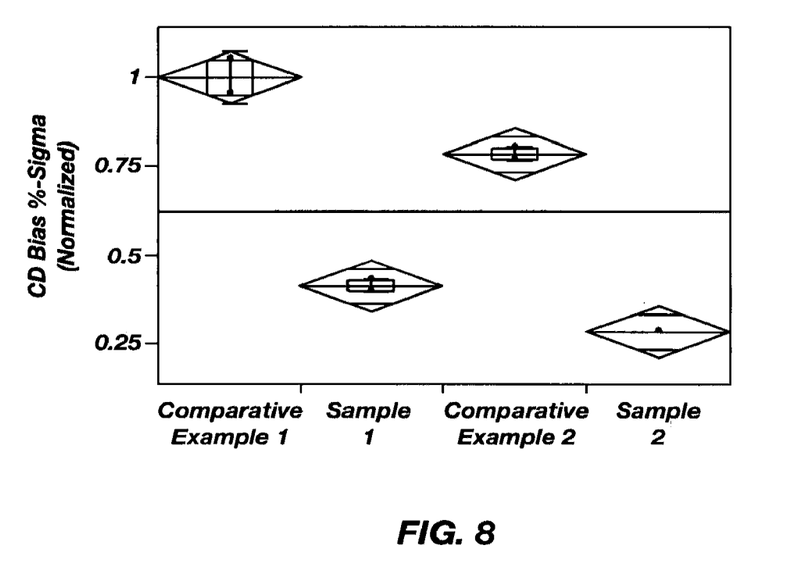
FIG. 8 is a plot showing within wafer uniformity resulting from use of conventional source gases in comparison to embodiments of the present invention.

FIG. 8 is a graphical representation of the within wafer uniformity (%-Sigma) of the CD bias and shows that the %-Sigma is substantially improved using the source gas described herein, due to the improvement in LER. Using the source gas that includes low amounts of O$_2$ (less than or equal to about 89% by volume of O$_2$) in accordance with embodiments of the present invention results in a wafer uniformity of less than about 5% 1-sigma. In contrast, a source gas that includes high amounts of O$_2$ (greater than or equal to about 90% by volume of O$_2$) results in a wafer uniformity of greater than about 16% 1-Sigma.

Example 2

Removal of Photoresist Defects and Mean CD Bias in Semiconductor Device Structures Intermediate semiconductor device structures that included a silicon substrate and a gate oxide were formed by methods known in the art. A photoresist layer was formed over the gate oxide, patterned and developed, which produced photoresist defects. To remove the photoresist defects, the intermediate semiconductor device structures were placed in a plasma chamber and exposed to each of the source gases shown in Table 2. The temperature, pressure and power at which the plasma chamber was maintained are also shown in Table 2, as are the flow rate of the source gases and the exposure time. Although the source gases in Table 2 vary, the operating conditions of the plasma chambers were identical. The RadiantStrip system was used as the plasma chamber for the source gas labeled "Comparative Example 3" and the RapidStrip system was used for the source gases "Comparative Example 4" and "Sample 3," the latter comprising an embodiment of the present invention.

TABLE 2

Source Gas Chemistries for Removing Photoresist Defects.

| Source gas | $O_2$ (% volume) | 4% $H_2$ in $N_2$ (% volume) | Temp (° C.) | Flow Rate (sccm) | Pressure (torr) | Power (watts) | Duration (sec) | CD Bias |
|---|---|---|---|---|---|---|---|---|
| Comparative Example 3 | 95 | 5 | 85 | 4700 | 0.5 | 1000 | 20 | 0.9 |
| Comparative Example 4 | 91 | 9 | 85 | 4700 | 0.5 | 1000 | 20 | 1.0 |
| Sample 3 | 9 | 91 | 85 | 4700 | 0.5 | 1000 | 20 | 0.7 |

Figure 9:
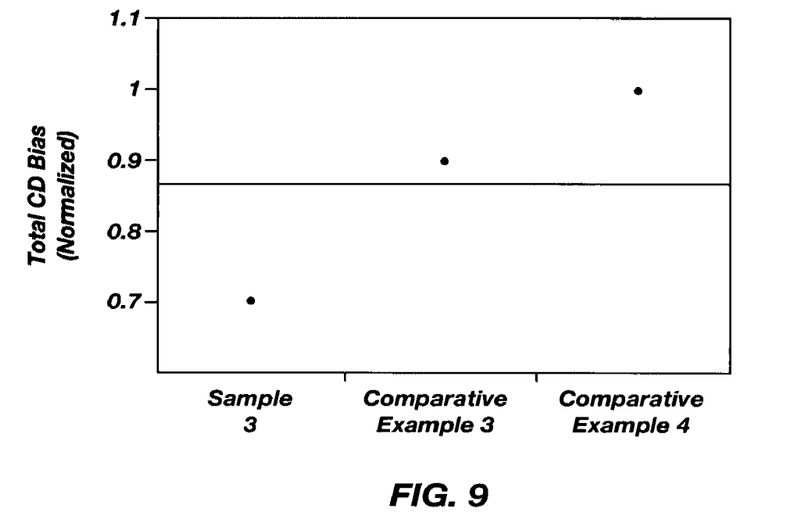
FIG. 9 is a plot showing mean CD bias in intermediate semiconductor device structures resulting from use of conventional source gases in comparison to an embodiment of the present invention.
Figure 10:
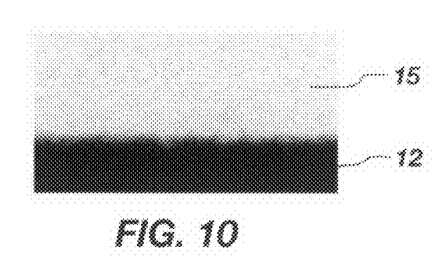
FIGS. 10-12 are Scanning Electron Microscope (SEM) photographs showing LER in intermediate semiconductor device structures resulting from use of conventional source gases in comparison to an embodiment of the present invention.
Figure 11:
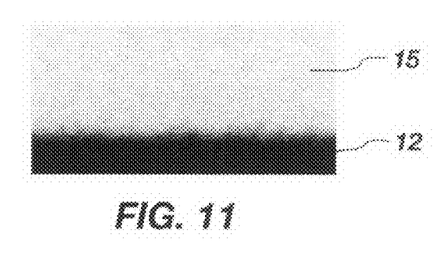
Figure 12:
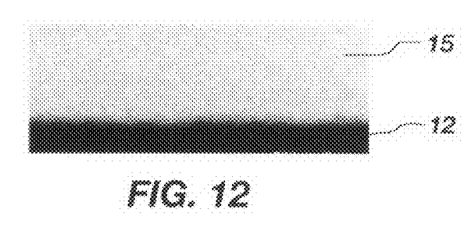

Table 2 shows CD bias as a normalized value. Normalized values were obtained by dividing the individual CD bias measurement for each tested source gas by the average result of the CD bias measurement for Comparative Example 3, thereby setting the mean of the Comparative Example 3 CD bias to 1.0. FIG. 9 is a plot of the mean CD bias in intermediate semiconductor device structures resulting from removal of photoresist defects using the source gases shown in Table 2. FIGS. 10-12 are SEM photographs showing the intermediate semiconductor device structures subsequent to descum, etching and stripping of the photoresist layer. The intermediate semiconductor device structures shown in each of FIGS. 10-12 have the silicon substrate 12 and the dielectric layer 15 (an oxide layer). FIG. 10 shows the LER formed by removing the photoresist defects using Comparative Example 3 as the source gas. FIG. 11 shows the LER formed by removing the photoresist defects using Comparative Example 4 as the source gas. FIG. 12 shows the LER formed by removing the photoresist defects using "Sample 3" as the source gas.

As shown in FIGS. 9-12, the intermediate semiconductor device structures fabricated using Comparative Example 3 and Comparative Example 4 as the source gases for removing the photoresist defects had a higher degree of LER and, thus, a higher mean CD bias, than intermediate semiconductor device structures fabricated using a source gas having a lower amount of $O_2$ according to an embodiment of the present invention.

While the invention is susceptible to various modifications as well as alternative forms and implementations, specific embodiments have been shown by way of example in the drawings and have been described in detail herein. However, it should be understood that the invention is not limited to the particular embodiments disclosed. Rather, the invention encompasses all modifications, equivalents, and alternatives falling within the spirit and scope of the invention as defined by the following appended claims.

What is claimed is:

1. A method for removing at least one photoresist defect from a substrate, comprising:
producing a plasma using a source gas comprising less than or equal to 10% by volume of oxygen and a non-oxidizing gas comprising ammonia or a mixture of hydrogen gas and nitrogen gas; and
exposing at least one photoresist defect on a substrate comprising a photoresist material to the plasma at a pressure within a range of from about 0.5 Torr to about 1.4 Torr to remove the at least one photoresist defect without substantially removing a remainder of the photoresist material.

2. The method of claim 1, wherein producing a plasma using a source gas comprising less than or equal to 10% by volume of oxygen and a non-oxidizing gas comprises using a source gas comprising from about 1% by volume to about 9% by volume of the oxygen.

3. The method of claim 1, wherein producing a plasma using a source gas comprising less than or equal to 10% by volume of oxygen and a non-oxidizing gas comprises using a source gas comprising about 5% by volume of the oxygen and about 95% by volume of the non-oxidizing gas.

4. The method of claim 1, wherein producing a plasma using a source gas comprising less than or equal to 10% by volume of oxygen and a non-oxidizing gas comprises using a source gas comprising about 1.25% by volume of the oxygen and about 98.75% by volume of the non-oxidizing gas.

5. The method of claim 1, wherein producing a plasma using a source gas comprising less than or equal to 10% by volume of oxygen and a non-oxidizing gas comprising ammonia or a mixture of hydrogen gas and nitrogen gas comprises using a non-oxidizing gas consisting of the mixture of hydrogen gas and nitrogen gas.

6. The method of claim 1, wherein producing a plasma using a source gas comprising less than or equal to 10% by volume of oxygen and a non-oxidizing gas comprising ammonia or a mixture of hydrogen gas and nitrogen gas comprises using a source gas comprising from about 1% by volume to about 9% by volume of the oxygen and a non-oxidizing gas comprising from about 2% by volume to about 25% by volume of the hydrogen gas and from about 75% by volume to about 98% by volume of the nitrogen gas.

7. The method of claim 1, wherein producing a plasma using a source gas comprising less than or equal to 10% by volume of oxygen and a non-oxidizing gas comprising ammonia or a mixture of hydrogen gas and nitrogen gas comprises using a non-oxidizing gas comprising about 3% by volume of the hydrogen gas and about 97% by volume of the nitrogen gas.

8. The method of claim 1, wherein producing a plasma using a source gas comprising less than or equal to 10% by volume of oxygen and a non-oxidizing gas comprises introducing the source gas into a plasma reactor at a total gas flow rate of from about 2000 standard cubic centimeters per minute to about 8000 standard cubic centimeters per minute.

9. The method of claim 1, wherein exposing at least one photoresist defect on a substrate comprising a photoresist material to the plasma comprises introducing the source gas into a plasma reactor containing the substrate at a flow rate of about 6000 standard cubic centimeters per minute.

10. The method of claim 1, wherein exposing at least one photoresist defect on a substrate comprising a photoresist material to the plasma at a temperature pressure within a range of from about 0.5 Torr to about 1.4 Torr to remove the at least one photoresist defect comprises exposing the at least one photoresist defect to the source gas at a temperature of about 70° C. and at a pressure of about 1 Torr to remove the at least one photoresist defect.

11. The method of claim 1, wherein exposing at least one photoresist defect on a substrate comprising a photoresist material to the plasma at a pressure within a range of from about 0.5 Torr to about 1.4 Torr to remove the at least one photoresist defect without substantially removing a remainder of the photoresist material comprises removing the at least one photoresist defect from sidewalls of the photoresist material without substantially removing the remainder of the photoresist material.

12. The method of claim 1, wherein exposing at least one photoresist defect on a substrate to the plasma at a pressure within a range of from about 0.5 Torr to about 1.4 Torr to remove the at least one photoresist defect without substantially removing the photoresist material comprises removing the at least one photoresist defect from a surface of the substrate extending between portions of the photoresist material without substantially removing the photoresist material having the at least one photoresist defect therebetween.

13. A method for processing a semiconductor device structure, comprising:
 forming a semiconductor device structure comprising a photoresist material on an exposed surface of the semiconductor device structure, the photoresist material comprising at least one photoresist defect therein;
 subjecting the exposed surface of the semiconductor device structure to a plasma produced from a source gas comprising from about 1% by volume to about 10% by volume of oxygen and a non-oxidizing gas comprising hydrogen gas and nitrogen gas at a pressure within a range of from about 0.5 Torr to about 1.4 Torr to remove the at least one photoresist defect without substantially removing at least a portion of the photoresist material.

14. The method of claim 13, wherein subjecting the exposed surface of the semiconductor device structure to a plasma produced from a source gas comprises subjecting the exposed surface of the semiconductor device structure to the plasma produced from a source gas comprising from about 1% by volume to about 1.25% by volume of the oxygen.

15. The method of claim 13, wherein subjecting the exposed surface of the semiconductor device structure to a plasma produced from a source gas comprises subjecting the exposed surface of the semiconductor device structure to the plasma produced from a source gas comprising from about 1% by volume to about 9% by volume of the oxygen.

16. The method of claim 13, wherein subjecting the exposed surface of the semiconductor device structure to a plasma produced from a source gas comprises subjecting the exposed surface of the semiconductor device structure to the plasma produced from a source gas comprising about 5% by volume of the oxygen and about 95% by volume of the non-oxidizing gas.

17. The method of claim 13, wherein subjecting the exposed surface of the semiconductor device structure to a plasma produced from a source gas comprises subjecting the exposed surface of the semiconductor device structure to the plasma produced from a source gas comprising about 1.25% by volume of the oxygen and about 98.75% by volume of the non-oxidizing gas.

18. The method of claim 13, wherein subjecting the exposed surface of the semiconductor device structure to a plasma produced from a source gas comprises subjecting the exposed surface of the semiconductor device structure to the plasma produced from a source gas comprising the oxygen and a non-oxidizing gas comprising from about 2% by volume to about 25% by volume of the hydrogen gas and from about 75% by volume to about 98% by volume of the nitrogen gas.

19. The method of claim 13, wherein subjecting the exposed surface of the semiconductor device structure to a plasma produced from a source gas comprises subjecting the exposed surface of the semiconductor device structure to the plasma produced from a source gas comprising the oxygen and a non-oxidizing gas comprising about 3% by volume of the hydrogen gas and about 97% by volume of the nitrogen gas.

20. The method of claim 13, wherein subjecting the exposed surface of the semiconductor device structure to a plasma produced from a source gas comprises subjecting the exposed surface of the semiconductor device structure to the plasma produced from the source gas to remove the at least one photoresist defect from surfaces of a semiconductor substrate without substantially removing the at least a portion of the photoresist material from adjacent surfaces.

21. A method for removing at least one photoresist defect from a substrate, comprising:
 producing a plasma from a source gas consisting of oxygen, hydrogen gas, and nitrogen gas; and
 exposing at least one photoresist defect on a substrate to the plasma to remove the at least one photoresist defect from sidewalls of a photoresist material overlying the substrate without substantially removing underlying portions of the photoresist material.

22. The method of claim 21, wherein producing a plasma from a source gas consisting of oxygen, hydrogen gas, and nitrogen gas comprises producing the plasma from a source gas consisting of from about 1% by volume to about 10% by volume of the oxygen and a mixture of about 4% by volume of the hydrogen gas in the nitrogen gas.

23. The method of claim 21, wherein producing a plasma from a source gas consisting of oxygen, hydrogen gas, and nitrogen gas comprises producing the plasma from a source gas consisting of about 1.25% by volume of the oxygen and a mixture of about 4% by volume of the hydrogen gas in the nitrogen gas.

24. The method of claim 21, wherein producing a plasma from a source gas consisting of oxygen, hydrogen gas, and nitrogen gas comprises producing the plasma from a source gas consisting of about 9% by volume of oxygen and a mixture of about 4% by volume of the hydrogen gas in the nitrogen gas.

25. The method of claim 21, wherein exposing at least one photoresist defect on a substrate to the plasma to remove the at least one phororesist defect comprises exposing the at least one photoresist defect on the substrate to the plasma at a temperature within a range of from about 70° C. to about 100° C.

26. The method of claim 21, wherein exposing at least one photoresist defect on a substrate to the plasma to remove the at least one phororesist defect comprises exposing the at least one photoresist defect on the substrate to the plasma at a temperature of about 70° C.

27. The method of claim 21, wherein exposing at least one photoresist defect on a substrate to the plasma to remove the at least one photoresist defect comprises exposing the at least one photoresist defect on the substrate to the plasma at a pressure within a range of from about 0.5 Torr to about 0.7 Torr.

* * * * *

UNITED STATES PATENT AND TRADEMARK OFFICE
CERTIFICATE OF CORRECTION

PATENT NO. : 8,372,754 B2
APPLICATION NO. : 11/786306
DATED : February 12, 2013
INVENTOR(S) : Robert J. Hanson et al.

It is certified that error appears in the above-identified patent and that said Letters Patent is hereby corrected as shown below:

In the Claims:

In column 10, line 59, in Claim 10, after "at a" delete "temperature".

In column 10, line 60, in Claim 10, delete "about about" and insert -- about --, therefor.

In column 12, line 47, in Claim 25, delete "phororesist" and insert -- photoresist --, therefor.

In column 12, line 53, in Claim 26, delete "phororesist" and insert -- photoresist --, therefor.

Signed and Sealed this
Seventh Day of May, 2013

Teresa Stanek Rea
*Acting Director of the United States Patent and Trademark Office*